United States Patent
Desai et al.

(10) Patent No.: US 6,340,626 B1
(45) Date of Patent: Jan. 22, 2002

(54) METHOD FOR MAKING A METALLIC PATTERN BY PHOTOLITHOGRAPHY

(75) Inventors: Kamalesh S. Desai, Hopewell Junction, NY (US); Brian D. Husson, Matamoras, PA (US); Mathias P. Jeanneret, Hopewell Junction; Stephen J. Tirch, III, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,631

(22) Filed: Jun. 16, 2000

(51) Int. Cl.[7] ............................................. H01L 21/322
(52) U.S. Cl. ................. 438/471; 438/618; 438/701; 438/678; 438/486; 438/637
(58) Field of Search .................. 438/471, 618, 438/701, 678, 687, 486, 52, 53, 637

(56) References Cited

U.S. PATENT DOCUMENTS 6,166,334 A * 12/2000 Galloway .................. 438/618
6,212,769 B1 * 4/2001 Boyko et al. .................. 29/852

* cited by examiner

Primary Examiner—Matthew Smith
Assistant Examiner—Igwe U. Anya
(74) Attorney, Agent, or Firm—Ratner & Prestia; Tiffany L. Townsend, Esq.

(57) ABSTRACT

A method for making a metallic pattern that includes redundant photolithography to significantly reduce the occurrence of defects in the metal layer that defines the desired metallic pattern. The presence of contaminants in the photoresist layer during exposure and developing away of portions of a photoresist layer can cause defects in the metal layer that defines the desired metallic pattern. Contaminants in the photoresist layer prevent portions of the photoresist layer from being exposed and developed away, so that portions of the photoresist layer that should be developed away remain in place, thereby causing the development of defects in the metal layer that defines the desired metallic pattern. These contaminants move to different positions during the developing away of the photoresist. By exposing those portions of the photoresist layer that are no longer shielded from exposure by the contaminants because the contaminants have moved to different positions, those portions of the photoresist layer now can be developed away, so that they are no longer present and no longer cause defects in the metal layer that defines the desired metallic pattern.

12 Claims, 3 Drawing Sheets

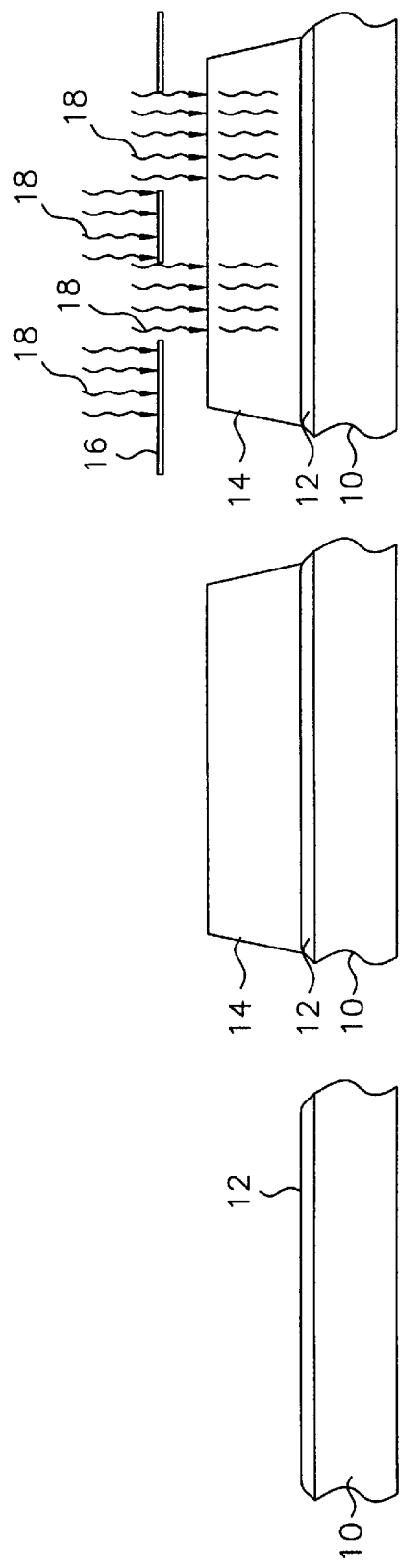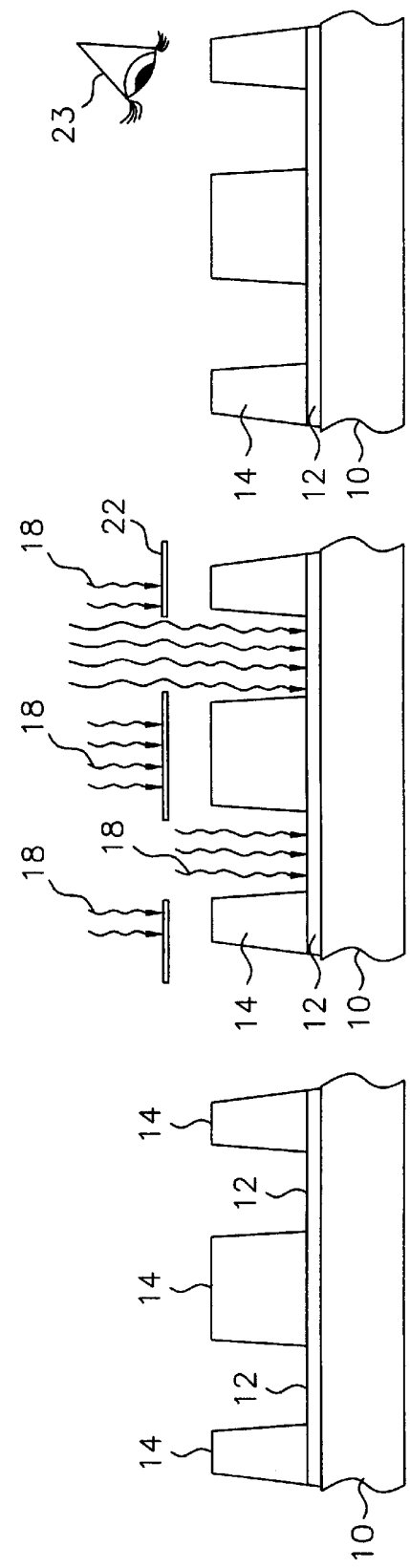

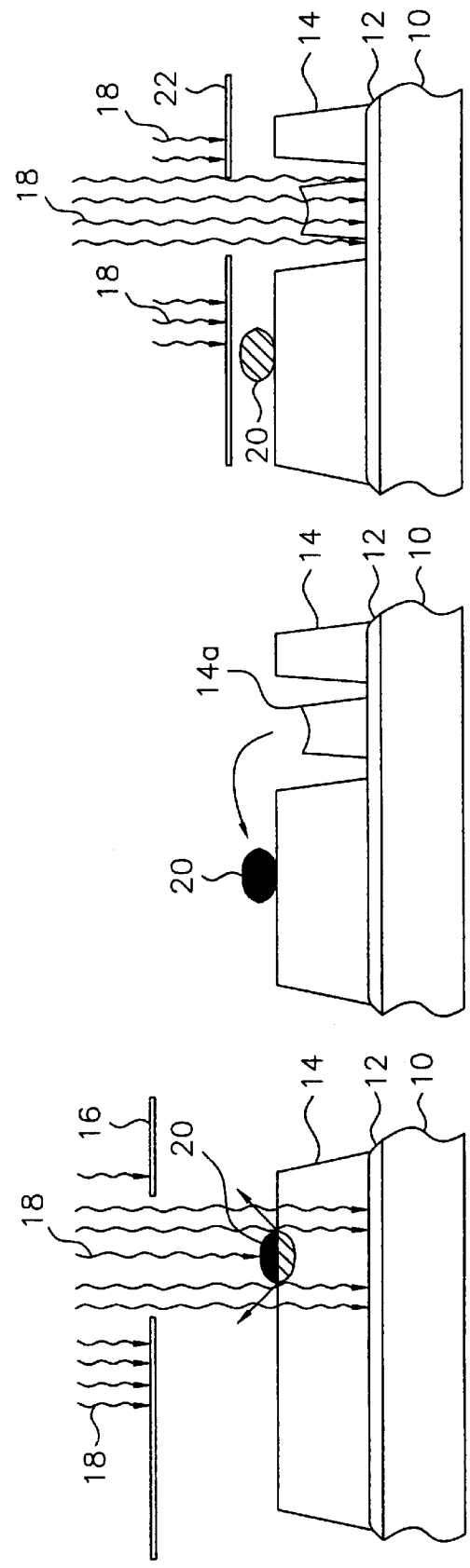
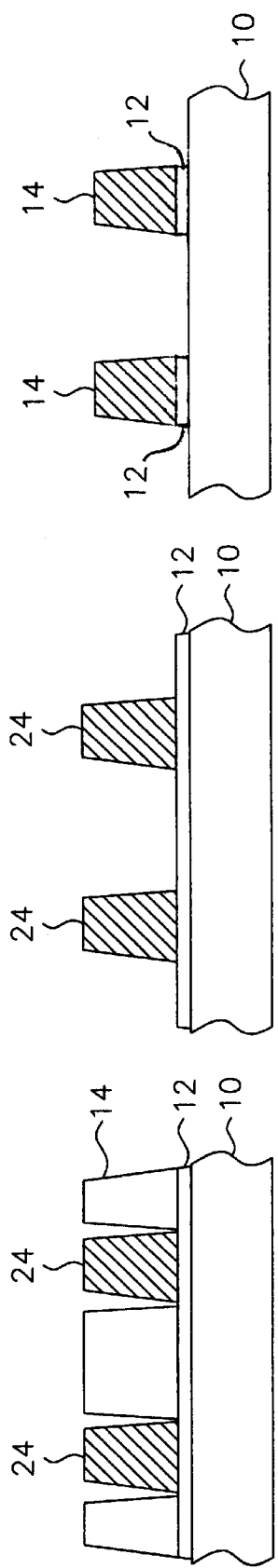

METHOD FOR MAKING A METALLIC PATTERN BY PHOTOLITHOGRAPHY

TECHNICAL FIELD

The present invention relates, in general, to making metallic patterns such as electrical printed circuits, integrated circuits and the like and, in particular, to a process that significantly reduces the occurrence of metal defects in the desired metallic patterns by twice exposing and twice developing away the photoresist layers used in defining the desired metallic patterns.

BACKGROUND OF THE INVENTION

In the manufacture of electrical printed circuits, integrated circuits and the like, defects in the metal layer occur quite frequently as the electrical circuits are being fabricated. Depending on the form of the metallic pattern and the method by which the metallic pattern is being fabricated, the defect can be an opening (e.g., an "open" or "void" in an electrical circuit) where no opening should exist or the presence of metal (e.g., a "bridge" in an electrical circuit) at a location where metal should not be present.

Many solutions for overcoming such metal defects, such as repairing that portion of the unit that has the defect, have been proposed in the past. Some of these solutions are very costly, while others are inadequate. In certain applications, the metal defects in the metal layer simply cannot be repaired. This leads to a significant scrap rate. In many instances, metal defects are difficult to detect. This poses a significant reliability risk.

SUMMARY OF THE INVENTION

It is an objective of the present invention to provide a new and improved method for making metallic patterns.

It is another objective of the present invention to provide a method of making electrical circuits, such as printed circuits, integrated circuits and the like, by which the occurrence of metal defects is greatly reduced.

It is yet another objective of the present invention to provide a method of making electrical circuits, such as printed circuits, integrated circuits and the like, by which the reduction in metal defects is achieved in a relatively simple manner and at a relatively low cost.

Accordingly, a method for making a metallic pattern, in accordance with the present invention, includes providing a substrate having a metal layer on a surface of the substrate and applying a photoresist layer onto the metal layer to cover the metal layer. Then, a desired pattern is patterned in the metal layer a first time and, after moving contaminants in the photoresist layer that have created defects in the pattern in the metal layer, the desired pattern is patterned in the metal layer a second time.

BRIEF DESCRIPTION OF THE DRAWINGS

The invention is best understood from the following detailed description when read in conjunction with the accompanying drawings.

FIG. 1A through 1I are cross-sectional views depicting the steps in making an electrical circuit in accordance with the present invention.

FIGS. 2A through 2D are cross-sectional views depicting the effect of the presence a contaminant in the photoresist layer in making an electrical circuit in accordance with the present invention.

DESCRIPTION OF THE INVENTION

Figure 4:
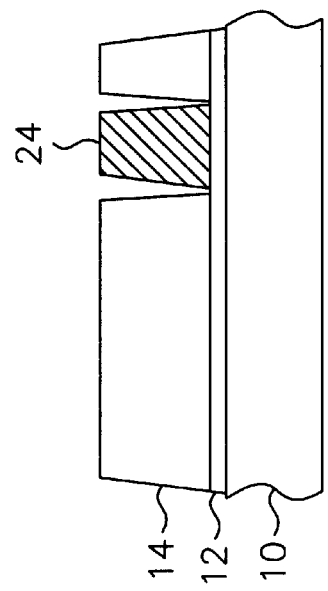
FIG. 4 is a cross-sectional view depicting the beneficial result of making an electrical circuit in accordance with the present invention notwithstanding the presence of a contaminant in the photoresist layer.

A method for making an electrical circuit, in accordance with the present invention, includes providing a substrate 10 having a seed metal layer 12 on a surface of the substrate as shown in FIG. 1A. This method also includes applying a photoresist layer 14 onto seed metal layer 12 to cover the seed metal layer as shown in FIG. 1B.

Then, as shown in FIG. 1C, a mask 16 containing a desired electric circuit pattern is placed over photoresist layer 14 and a light, represented by lines 18, is applied a first time through openings in mask 16 to expose portions of photoresist layer 14 that are not shielded from the light by the electrical circuit pattern of the mask. After exposure, those portions of photoresist layer 14 that have been exposed by light 18 are developed away to uncover portions of seed metal layer 12 as shown in FIG. 1D.

In the event that photoresist layer 14 contains contaminants, those portions of the photoresist layer shielded by the contaminants from the light source from which light 18 originates are not exposed and not developed away. This is shown in FIG. 2A where a contaminant is identified by reference numeral 20.

As shown by FIG. 2B, contaminant 20 is moved to a new position in the photoresist layer. This can occur while portions of photoresist layer 14 are developed away the first time, such as by spinning the unit which is a conventional way of developing away exposed portions of the photoresist layer. That portion of photoresist 14 located below the original position of contaminant 20, namely photoresist 14a, however, remains unexposed and in place.

To remove unexposed photoresist 14a, light 18 is applied a second time to expose those portions of photoresist layer 14 that were prevented previously during the first application of light from being exposed by contaminants. According to the embodiment of the invention being described, this second application of light 18 is, as shown by FIG. 1E and 2C, through openings in a second mask 22 placed over the remaining photoresist layer 14 and containing the desired electrical circuit pattern, but with reduced size openings. The reduced size openings in second mask 22 are set not to exceed the minimum openings in first mask 16 with maximum tolerances on the openings in the first mask factored into the determinations of the minimum openings of the first mask. In particular, the reduced size openings in second mask 22 are in the range of five percent to ten percent of the size of the openings in first mask 16.

Figure 2D:
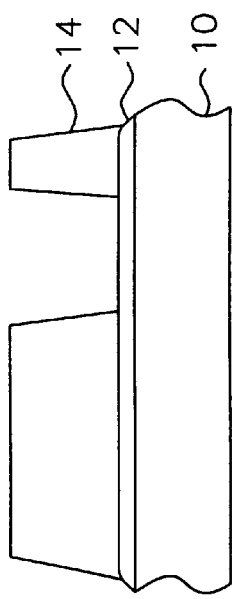

The next step, as shown by FIG. 1F and 2D is developing away a second time those portions of photoresist layer 14 that have been exposed by the second application of light 18. This uncovers additional portions of seed metal layer 12. The representation of an eye 23 in FIG. 1F signifies inspection for defects in seed metal layer 12.

Next, according to the embodiment of the invention being described, a metal plate 24 is applied to those portions of seed metal layer 12 uncovered by the developing away of photoresist layer 14. This is shown in FIG. 1G.

Then the remaining portions of photoresist layer 14 are removed, for example by exposure to light and developing away. This is shown in FIG. 1H.

Finally, as shown in FIG. 11, portions of seed metal layer 12 not covered by metal plate 24 are removed leaving the desired plated electrical circuit on substrate 10.

Figure 3:
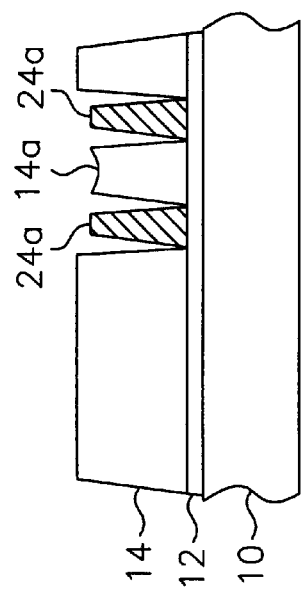
FIG. 3 is a cross-sectional view depicting the adverse result of the presence of a contaminant in the photoresist layer when making an electrical circuit not in accordance with the present invention.

FIG. 3 is a cross-sectional view depicting the adverse result of the presence of a contaminant in the photoresist layer when making an electrical circuit not in accordance with the present invention. With portion 14a of photoresist layer 14 not developed away, metal plate parts 24a are separated by portion 14a of photoresist layer 14 that has not been developed away. In contrast, as shown by FIG. 4, which is a cross-sectional view depicting the beneficial result of making an electrical circuit in accordance with the present invention notwithstanding the presence of a contaminant in photoresist layer 14, a single metal plate 24 is formed as intended.

It will be understood that the present invention can be used in the formation of an electrical circuit from a metal layer that is applied directly to the substrate, so that this metal layer itself will be the patterned electrical circuit, instead of plating the desired patterned electrical circuit onto a seed metal layer that has been applied to the substrate. In a second embodiment of the present invention, metal layer 12, instead of being a seed metal layer that functions in the formation of a plated-on electrical circuit, is a metal layer from which the desired electrical circuit is formed. Under such circumstances, those portions of metal layer in FIG. 1F that are not covered by the remaining portions of photoresist layer 14 are removed, for example by etching. Next, the remaining portions of photoresist layer 14 are removed, for example by exposure and developing away.

Although illustrated and described herein with reference to certain exemplary embodiments, the present invention is nevertheless not intended to be limited to the details shown. Rather, various modifications may be made to those exemplary embodiments within the scope and range of equivalents of the claims and without departing from the invention.

What is claimed:

1. A method for making an electrical circuit comprising the steps of:

providing a substrate having a seed metal layer on a surface of said substrate;

applying a photoresist layer onto said seed metal layer to cover said seed metal layer;

placing a mask containing a desired electrical circuit pattern over said photoresist layer;

applying light a first time through openings in said mask to expose portions of said photoresist layer not shielded from said light by said electrical circuit pattern of said mask;

developing away a first time those portions of said photoresist layer that have been exposed by said light to uncover portions of said seed metal layer;

moving to new positions contaminants in the photoresist layer that have prevented portions of said photoresist layer from being exposed by said light and have prevented those portions of said photoresist layer from being developed away;

applying light a second time to expose those portions of said photoresist layer that were prevented previously during the first application of light from being exposed by said contaminants;

developing away a second time those portions of said photoresist layer that have been exposed by the second application of said light to uncover additional portions of said seed metal layer;

applying a metal plate to those portions of said seed metal layer uncovered by the developing away of said photoresist layer;

removing remaining portions of said photoresist layer; and removing portions of said seed metal layer not covered by said metal plate.

2. A method for making an electrical circuit comprising the steps of:

providing a substrate;

applying a seed metal layer onto said substrate;

applying a photoresist layer onto said seed metal layer to cover said seed metal layer;

placing a first mask containing a desired electrical circuit pattern over said photoresist layer;

applying light a first time through openings in said first mask to expose portions of said photoresist layer not shielded from said light by said electrical circuit pattern of said first mask;

developing away a first time those portions of said photoresist layer that have been exposed by said uncover portions of said seed metal layer;

moving to new positions contaminants in the photoresist layer that have prevented portions of said photoresist layer from being exposed by said light and have prevented those portions of said photoresist layer from being developed away;

placing a second mask containing said desired electrical circuit pattern, but with reduced size openings, over the remaining photoresist layer;

applying light a second time through said reduced size openings in said second mask to expose those portions of said photoresist layer that were prevented previously during the first application of light from being exposed by said contaminants;

3. A method for making an electrical circuit comprising the steps of:

providing a substrate;

applying a seed metal layer onto said substrate;

applying a photoresist layer onto said seed metal layer to cover said seed metal layer;

placing a first mask containing a desired electrical circuit pattern over said photoresist layer;

applying light a first time through openings in said first mask to expose portions of said photoresist layer not shielded from said light by said electric circuit pattern of said first mask;

developing away a first time those portions of said photoresist layer that have been exposed by said light to uncover portions of said seed metal layer;

moving to new positions contaminants in the photoresist layer that have prevented portions of said photoresist layer from being exposed by said light and have prevented those portions of said photoresist layer from being developed away;

placing a second mask containing said desired electric circuit pattern, but with reduced size openings, over the remaining photoresist layer;

applying light a second time through said reduced size openings in said second mask to expose those portions of said photoresist layer that were prevented previously during the first application of light from being exposed by said contaminants;

developing away a second time those portions of said photoresist layer that have been exposed by the second application of said light to uncover additional portions of said seed metal layer;

applying a metal plate to those portions of said seed metal layer uncovered by the developing away of said photoresist layer;

removing remaining portions of said photoresist layer; and removing portions of said seed metal layer not covered by said metal plate.

4. A method for making an electrical circuit according to claim 3 wherein said reduced size openings in said second mask are set not to exceed the minimum openings in said first mask with maximum tolerances on said openings in said first mask factored into the determinations of said minimum openings of said first mask.

5. A method for making an electrical circuit according to claim 3 wherein said reduced size openings in said second mask are in the range of five percent to ten percent of the size of said openings in said first mask.

6. A method for making an electrical circuit comprising the steps of:

providing a substrate having a metal layer on a surface of said substrate;

applying a photoresist layer onto said metal layer to cover said metal layer;

placing a mask containing a desired electrical circuit pattern over said photoresist layer;

applying light a first time through openings in said mask to expose portions of said photoresist layer not shielded from said light by said electrical circuit pattern of said mask;

developing away a first time those portions of said photoresist layer that have been exposed by said light to uncover portions of said metal layer;

moving to new positions contaminants in the photoresist layer that have prevented portions of said photoresist layer from being exposed by said light and have prevented those portions of said photoresist layer from being developed away;

applying light a second time to expose those portions of said photoresist layer that were prevented previously during the first application of light from being exposed by said contaminants;

developing away a second time those portions of said photoresist layer that have been exposed by the second application of said light to uncover additional portions of said metal layer;

removing portions of said metal layer not covered by remaining portions of said photoresist layer; and removing remaining portions of said photoresist layer.

7. A method for making an electrical circuit according to claim 6 wherein said contaminants move to different positions while portions of said photoresist layer are developed away the first time.

8. A method for making an electrical circuit comprising the steps of:

providing a substrate;

applying a metal layer onto said substrate;

applying a photoresist layer onto said metal layer to cover said metal layer;

placing a first mask containing a desired electrical circuit pattern over said photoresist layer;

applying light a first time through openings in said first mask to expose portions of said photoresist layer not shielded from said light by said electric circuit pattern of said first mask;

developing away those portions of said photoresist layer that have been exposed by said light to uncover portions of said metal layer;

moving to new positions contaminants in the photoresist layer that have prevented portions of said photoresist layer from being exposed by said light and have prevented those portions of said photoresist layer from being developed away;

placing a second mask containing said desired electrical circuit pattern, but with reduced size openings, over the remaining photoresist layer;

applying light a second time through said reduced size openings in said second mask to expose those portions of said photoresist layer that were prevented previously during the first application of light from being exposed by said contaminants;

developing away a second time those portions of said photoresist layer that have been exposed by the second application of said light to uncover additional portions of said metal layer;

removing portions of said metal layer not covered by remaining portions of said photoresist layer; and removing remaining portions of said photoresist layer.

9. A method for making an electrical circuit according to claim 8 wherein said reduced size openings in said second mask are set not to exceed the minimum openings in said first mask with maximum tolerances on said openings in said first mask factored into the determinations of said minimum openings of said first mask.

10. A method for making an electrical circuit according to claim 8 wherein said reduced size openings in said second mask are in the range of five percent to ten percent of the size of said openings in said first mask.

11. A method for making a metallic pattern comprising the steps of:

providing a substrate having a metal layer on a surface of said substrate;

applying a photoresist layer onto said metal layer to cover said metal layer;

placing a mask containing a desired pattern over said photoresist layer;

applying light a first time through openings in said mask to expose portions of said photoresist layer not shielded from said light by said pattern of said mask;

developing away a first time those portions of said photoresist layer that have been exposed by said light to uncover portions of said metal layer;

moving to new positions contaminants in the photoresist layer that have prevented portions of said photoresist layer from being exposed by said light and have prevented those portions of said photoresist layer from being developed away;

applying light a second time to expose those portions of said photoresist layer that were prevented previously during the first application of light from being exposed by said contaminants; and developing away a second time those portions of said photoresist layer that have been exposed by the second application of said light to uncover additional portions of said seed metal layer.

12. A method for making a metallic pattern comprising the steps of:

provided a substrate having a metal layer on a surface of said substrate;

applying a photoresist layer onto said metal layer to cover said metal layer;

patterning a first time a desired pattern in said metal layer;

moving to new positions contaminants in the photoresist layer that have created defects in said pattern in said metal layer; and patterning a second time said desired pattern in said metal layer.

* * * * *